(12) United States Patent
Kim et al.

(10) Patent No.: US 8,421,338 B2
(45) Date of Patent: Apr. 16, 2013

(54) ORGANIC LUMINESCENCE DISPLAY PANEL

(75) Inventors: Kwang-Hyun Kim, Daegu-si (KR); Sung-Hoon Choi, Gyeonggi-do (KR); Kyu-Il Han, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 193 days.

(21) Appl. No.: 12/534,453

(22) Filed: Aug. 3, 2009

(65) Prior Publication Data

US 2010/0052522 A1 Mar. 4, 2010

(30) Foreign Application Priority Data

Aug. 29, 2008 (KR) .................. 10-2008-0084972

(51) Int. Cl.
*H01L 51/00* (2006.01)
*H01L 51/52* (2006.01)
*H01L 51/54* (2006.01)

(52) U.S. Cl.
USPC .......................................... 313/504; 313/506

(58) Field of Classification Search .......... 313/498–512; 428/690, 918
See application file for complete search history.

(56) References Cited

U.S. PATENT DOCUMENTS

| | | | |
|---|---|---|---|
| 2003/0010959 A1* | 1/2003 | Lee et al. ........................ | 252/500 |
| 2005/0037234 A1* | 2/2005 | Kim et al. ....................... | 428/690 |
| 2005/0142384 A1* | 6/2005 | Itai ................................. | 428/690 |
| 2007/0020484 A1* | 1/2007 | Kim et al. ....................... | 428/690 |

* cited by examiner

*Primary Examiner* — Karabi Guharay
*Assistant Examiner* — Zachary J Snyder
(74) *Attorney, Agent, or Firm* — Morgan, Lewis & Bockius LLP

(57) ABSTRACT

The present invention relates to an organic luminescence display panel and a method for fabricating the same which can improve a lifetime and luminous efficiency of an organic luminescence display device.

The organic luminescence display panel includes a first electrode connected to a thin film transistor formed on a substrate, an organic layer having a light emission layer formed on the first electrode, a second electrode formed opposite to the first electrode with the organic layer disposed therebetween, a buffer layer formed between the first electrode and the light emission layer of a mixture of an inorganic material of an inorganic halide compound having fluorine and an organic material for interface stabilization between the first electrode and the organic layer, and an electron acceptor layer of an organic material having a strong electron accepting action group selected from cyanide group —CN, —NC, hydroxy group —OH, or halide group —I, Br, —F for making hole injection and transportation between the buffer layer and the light emission layer easy.

10 Claims, 16 Drawing Sheets

ORGANIC LUMINESCENCE DISPLAY PANEL

CROSS REFERENCE TO RELATED APPLICATION

This application claims the benefit of the Patent Korean Application No. 10-2008-0084972, filed on Aug. 29, 2008, which is hereby incorporated by reference as if fully set forth herein.

BACKGROUND OF THE DISCLOSURE

1. Field of the Disclosure

The present invention relates to an organic luminescence display panel and a method for fabricating the same which can improve a lifetime and luminous efficiency of an organic luminescence display device.

2. Discussion of the Related Art

A display device, a core technology in a time of information and communication for displaying various pieces of information as pictures, is being developed in a direction of thinner, lighter, portable and high performance. According to this, the organic luminescence display device (OLED) and the like which can reduce weight and volume that are disadvantages of a cathode ray tube (CRT) are spotlighted. The OLED, a light emitting device which uses a thin light emission layer between electrodes, has an advantage of making thin like paper.

An active matrix OLED (AMOLED) has a matrix of pixels each with three colored subpixels of R, G, B for displaying a picture. The subpixel has an organic electro-luminescence (OEL) cell, and a cell driver for driving the OEL cell independently. The cell driver has a gate line for supplying a scan signal, a data line for supplying a video data signal, and at least two thin film transistor and storage capacitors connected between common power lines which supply common power signals, for driving a cathode of the OEL cell. The OEL cell has a cathode connected to the cell driver, an organic layer on the cathode, and an anode on the organic layer. The organic layer has a hole injection layer, a hole transport layer, a light emission layer, an electron injection layer, and an electron transport layer. A lifetime of the OEL cell is limited due to degradation of the OEL cell caused by improper current injection to the OEL cell coming from instable interface between the anode and the hole injection layer, if a current is applied to the OEL cell. In order to correct such an interface instability, a buffer layer is provided between the anode and the hole injection layer for improving the lifetime. However, the buffer layer becomes a barrier to require a higher driving voltage for increasing efficiency of the light emission layer. Moreover, since the hole has a moving speed higher than the electron such that the hole is not trapped at the light emission layer, but moves to the electron transport layer, to impair the efficiency of the light emission layer.

SUMMARY OF THE DISCLOSURE

Accordingly, the present invention is directed to an organic luminescence display panel and a method for fabricating the same.

An object of the present invention is to provide an organic luminescence display panel and a method for fabricating the same an organic luminescence display device.

Additional advantages, objects, and features of the disclosure will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an organic luminescence display panel includes a first electrode connected to a thin film transistor formed on a substrate, an organic layer having a light emission layer formed on the first electrode, a second electrode formed opposite to the first electrode with the organic layer disposed therebetween, a buffer layer formed between the first electrode and the light emission layer of a mixture of an inorganic material of an inorganic halide compound having fluorine and an organic material for interface stabilization between the first electrode and the organic layer, and an electron acceptor layer of an organic material having a strong electron accepting action group selected from cyanide group —CN, —NC, hydroxy group —OH, or halide group —I, Br, —F for making hole injection and transportation between the buffer layer and the light emission layer easy.

In another aspect of the present invention, an organic luminescence display panel includes a first electrode connected to a thin film transistor formed on a substrate, an organic layer having a light emission layer formed on the first electrode, a second electrode formed opposite to the first electrode with the organic layer disposed therebetween, a hole block material layer formed between a light emission layer and the second electrode of a mixture of a hole blocking material of Balq (bis(2-methyl-8-quinolinolato) (p-phenylphenolato) aluminum(III)) and an electron injection material of Liq (Lithium quinolate), for trapping holes at the light emission layer.

In the other aspect of the present invention, an organic luminescence display panel includes a first electrode connected to a thin film transistor formed on a substrate, an organic layer having a light emission layer formed on the first electrode, a second electrode formed opposite to the first electrode with the organic layer disposed therebetween, a hole block material layer, between the light emission layer and the second electrode, formed of a mixture of a hole blocking material of Balq (bis(2-methyl-8-quinolinolato) (p-phenylphenolato) aluminum(III)) and an electron injection material of Liq (Lithium quinolate), for trapping holes at the light emission layer, a buffer layer formed between the first electrode and the light emission layer of a mixture of an inorganic material of an inorganic halide compound having fluorine and an organic material for interface stabilization between the first electrode and the organic layer, and an electron acceptor layer of an organic material having a strong electron accepting action group selected from cyanide group —CN, —NC, hydroxy group —OH, or halide group —I, Br, —F for making hole injection and transportation between the buffer layer and the light emission layer easy.

It is to be understood that the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure. In the drawings.

DESCRIPTION OF SPECIFIC EMBODIMENTS

Reference will now be made in detail to the specific embodiments of the present invention, examples of which are illustrated in the accompanying drawings 1 to 12. Wherever possible, the same reference numbers will be used throughout the drawings to refer to the same or like parts.

Figure 1:
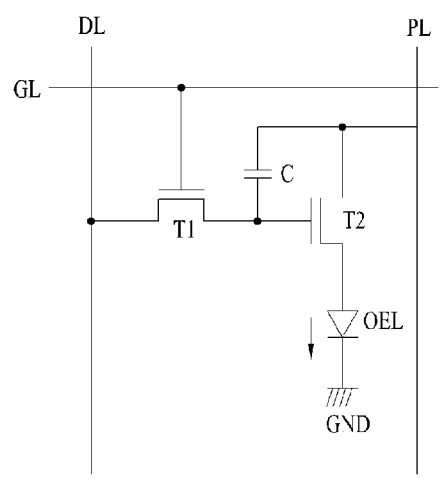
FIG. 1 illustrates an equivalent circuit of a pixel in an organic luminescence display panel in accordance with the present invention.
Figure 2:
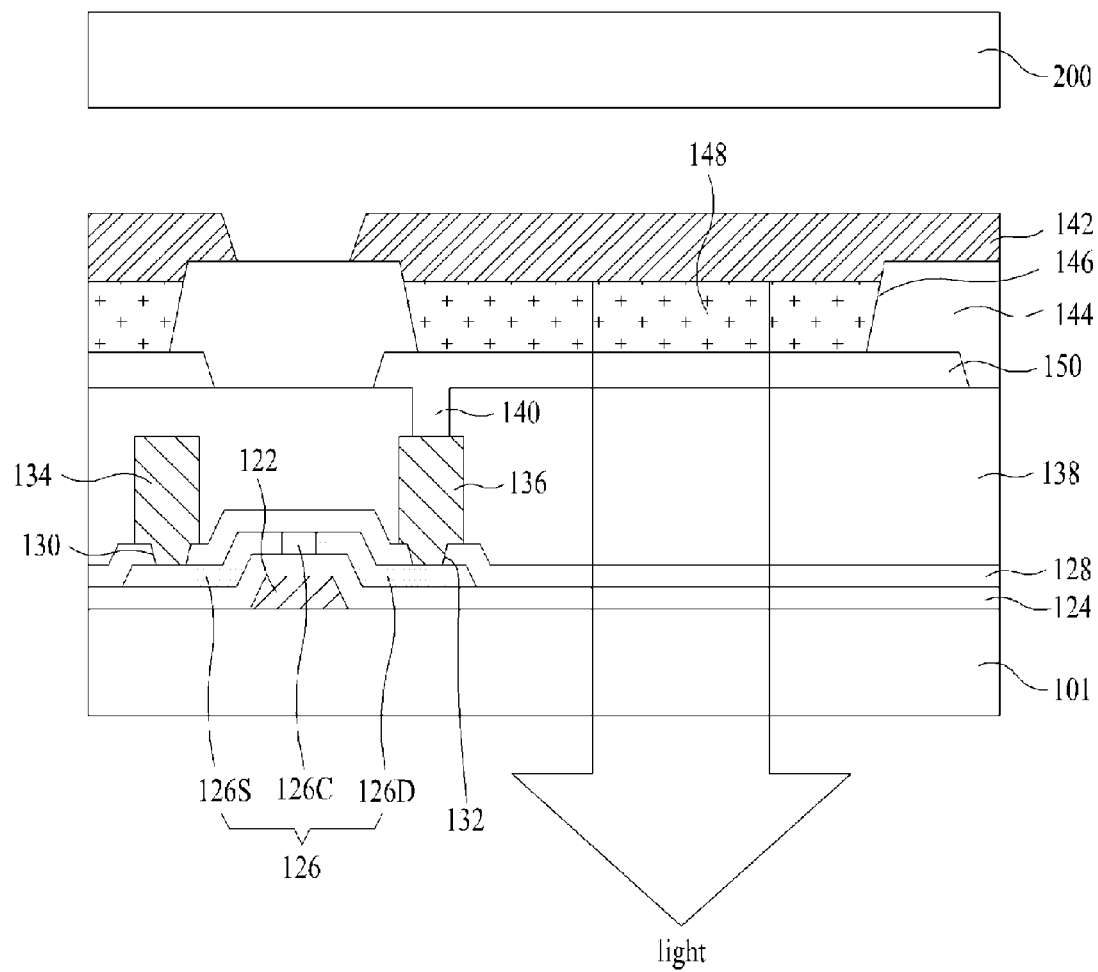
FIG. 2 illustrates a vertical section of the pixel in the organic luminescence display panel in FIG. 1.

FIG. 1 illustrates an equivalent circuit of a pixel in an organic luminescence display panel in accordance with the present invention, and FIG. 2 illustrates a vertical section of the pixel in the organic luminescence display panel in FIG. 1.

Referring to FIGS. 1 and 2, a pixel of the organic luminescence display panel includes a switch thin film transistor T1 connected to a gate line GL and a data line DL, a drive thin film transistor T2 connected to the switch thin film transistor T1, a power line PL, and an OEL cell, a storage capacitor C connected between the power line PL and a drain electrode of the switch thin film transistor T1, and the OEL cell connected to the drive thin film transistor T2.

The switch thin film transistor T1 has a gate electrode connected to the gate line GL, a source electrode connected to the data line DL, and a drain electrode connected to a gate electrode and a storage capacitor C of the drive thin film transistor T2. The drive thin film transistor T2 has a source electrode connected to the power line PL, a drain electrode connected one of electrodes of the OEL cell. The storage capacitor C is connected between the power line PL and the gate electrode of the drive thin film transistor T2.

The switch drive thin film transistor T1 is turned on upon reception of a scan pulse at the gate line GL for supplying a data signal from the data line DL to the storage capacitor C and the gate electrode of the drive thin film transistor T2. The drive thin film transistor T2 controls a current being supplied from the power line PL to the OEL cell in response to the data signal supplied to the gate electrode for controlling a light emission quantity from the OEL cell. The drive thin film transistor T2 also sustains the light emission from the OEL cell by supplying a fixed current I from the storage capacitor C to the OEL cell until the data signal of the next frame is supplied even if the switch thin film transistor T1 is turned off.

Referring to FIG. 2, the drive thin film transistor T2 includes a gate electrode 122 formed on a lower substrate 101, a gate insulating film 124 covering the gate electrode 122, a semiconductor layer 126 formed on the gate insulating film 124, an interlayer insulating film 128 covering the semiconductor layer 126, and source electrode 134 and drain electrode 136 respectively connected to source region 126S and a drain region 126D of the semiconductor layer 126 through first and second contact holes 130 and 132 passed through the interlayer insulating film covering the semiconductor layer 126. The semiconductor layer 126 is an LTPS thin film and includes a channel region 126C overlapped with the gate electrode 122, and a source region 126S and a drain region 126D opposite to the channel region 126C not overlapped with the gate electrode 122 having impurities injected thereto.

The OEL cell includes a first electrode 150 on a protective film 138 covering the drive thin film transistor T2, a bank insulating film 144 having an organic hole 146 for exposing the first electrode 150, an organic layer 148 having a light emission layer formed on the first electrode 150 exposed through the organic hole 146, and a second electrode 142 formed on the organic layer 148.

The first electrode 150, an anode, is formed of a transparent conductive material, like TCO (Transparent Conductive Oxide), such as ITO (Indium Tin Oxide) and IZO (Indium Zinc Oxide).

The second electrode 142, a cathode, may be formed of two or more than two layers of non-transparent conductive materials, such as aluminum Al and the like. The two or more than two layers in the second electrode 142 may be formed of, for an example, magnesium Mg and aluminum Al.

Figure 3:
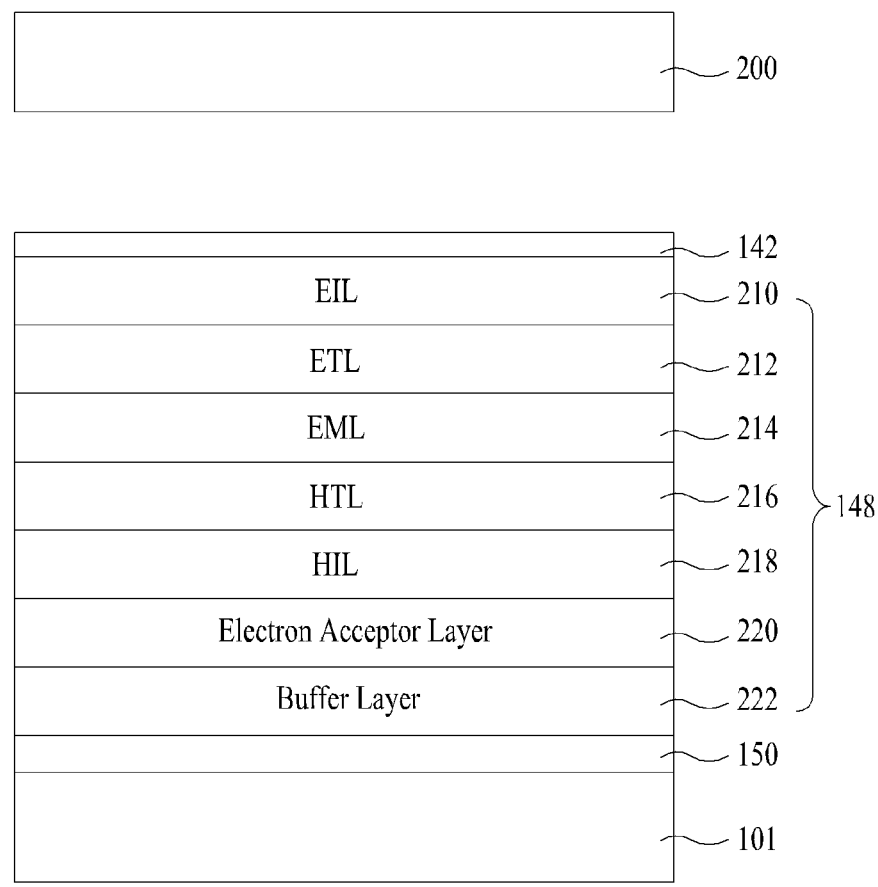
FIG. 3 illustrates a section of the organic luminescence display panel in accordance with a first preferred embodiment of the present invention, schematically.
Figure 4:
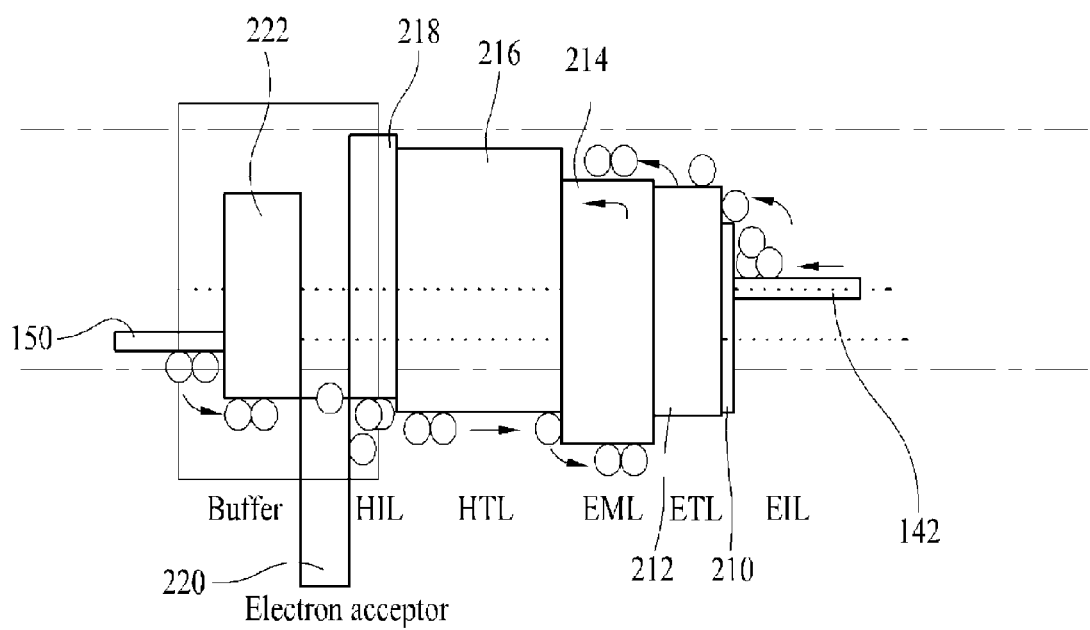
FIG. 4 illustrates an energy-band diagram of the organic layer in FIG. 3.

Referring to FIGS. 3 and 4, the organic layer 148 includes a buffer layer 222, an electron acceptor layer 220, a hole injection layer HIL 218, a hole transport layer HTL 216, a light emission layer EML 214, an electron transport layer ETL 212, and an electron injection layer EIL 210 stacked on the first electrode 150 in succession. A light, emitted as an exciton which is a combination of the hole and the electron in the light emission layer 214 of the organic layer 148 returns to a bottom state, is directed toward the lower substrate 101.

The buffer layer 222, which stabilizes an interface between the first electrode 150 and the hole injection layer 218, is formed of a mixture of an organic material and an inorganic material. The inorganic material is an inorganic halide compound having fluorine selected from $MgF_2$, LiF, NaF, KF, RbF, CsF, FrF, $CaF_2$, or so on. The organic material may be a material which permits smooth hole injection and hole transportation, such as NPB (N,N-di(naphthalene-1-yl)-N,N-diphenyl-benzidene). The buffer layer 222 may be formed of a mixture of an inorganic material and an organic material mixed in a ratio of 1:3.

The buffer layer 222 formed between the first electrode 150 and the hole injection layer 218 stabilizes the interface between the first electrode 150 and the hole injection layer 218. As a result, the current injection becomes easy, and the degradation and stress of the organic layer 148 are prevented, so that a device lifetime is increased.

The electron acceptor layer 220 between the buffer layer 222 and the hole injection layer 218 is formed of an organic material that has an electron accepting material for making smooth hole injection and transportation. In other words, the electron accepting material is the organic material having a strong electron accepting action group, selected from cyanide group —CN, —NC, hydroxy group —OH, or halide group —I, Br, —F.

That is, the strong electron accepting action group, such as cyanide CN, and —NC serves as an electron accepting body, and a material of an electron accepting body shown in above chemical formula 1 is LGC101.

The electron acceptor layer 220 can prevent from requiring a high drive voltage—by increasing resistance caused by the buffer layer 222 provided between the first electrode 150 and the hole injection layer 218 to act as a barrier. That is, the electron acceptor layer 220 makes smooth hole injection and transportation, making concentrations(density) of the holes and the electrons balanced at the light emission layer 214, thereby minimizing an increase of voltage at the time of current drive.

That is, the electron acceptor layer 220 makes to increase distribution of the holes at the interface of the buffer layer 222 and the interface of the hole transport layer 216 and to elevate an energy level by pilling electrons to the interface of the buffer layer 222 and the hole transport layer 216, thereby improving efficiency.

In the meantime, the buffer layer 222 may have a thickness of 100 Å~300 Å, and the electron acceptor layer 220 may have a thickness of 100 Å~100 Å. It is preferable that the buffer layer 222 has a thickness of 150 Å, and the electron acceptor layer 220 has a thickness of 50 Å.

Figure 5A:
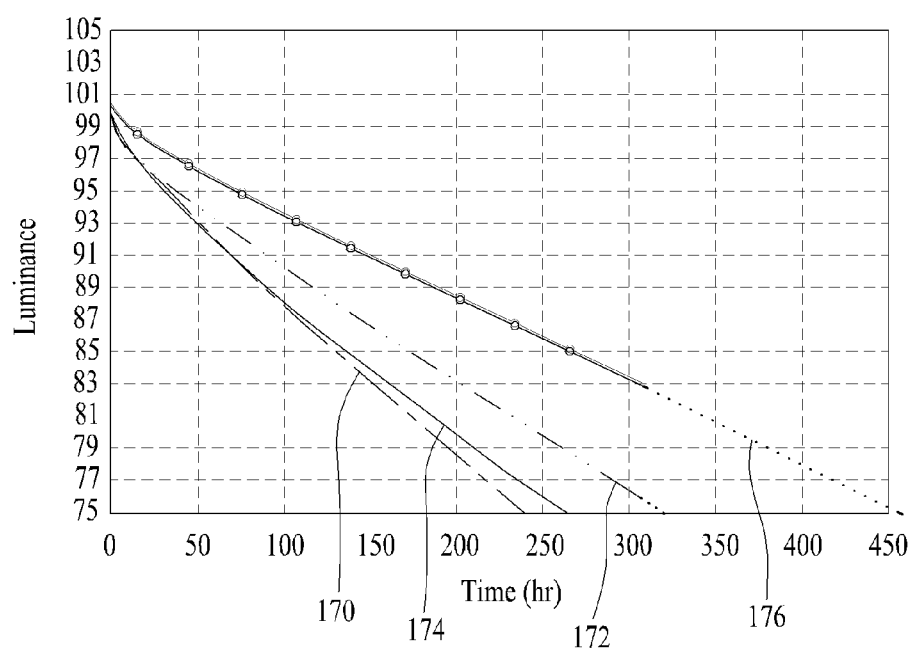
FIG. 5A illustrates a graph of a lifetime vs. a luminance of the organic luminescence display panel in accordance with a first preferred embodiment of the present invention.
Figure 5B:
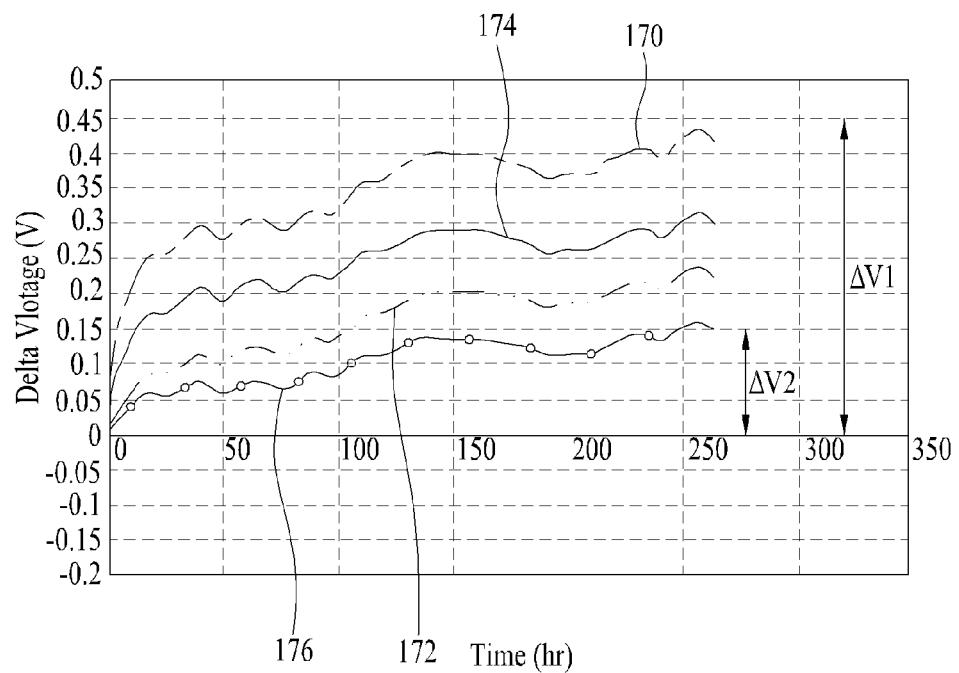
FIG. 5B illustrates a graph of a lifetime vs. a delta voltage of the organic luminescence display panel in accordance with a first preferred embodiment of the present invention.

Results as shown in table 1, FIGS. 5A and 5B can be obtained if the buffer layer 222 has a thickness of 150 Å and the electron acceptor layer 220 has a thickness of 50 Å.

In detail, table 1 shows test values of the organic layer in different conditions, wherein a first condition is a case of the related art organic layer only, a second condition is a case of the organic layer with a buffer layer having a thickness of 150 Å, a third condition is a case of the organic layer with an electron acceptor layer having a thickness of 50 Å, and a fourth condition is a case of the organic layer both with a buffer layer having a thickness of 150 Å and an electron acceptor layer having a thickness of 50 Å. In table 1, V denotes a voltage, cd/A denotes luminance, lm/W denotes a current, CIE_x and CIE_y denote color coordinates, Δ V denotes a driving voltage, and lifetime denotes a lifetime of the device.

Chemical Formula 1

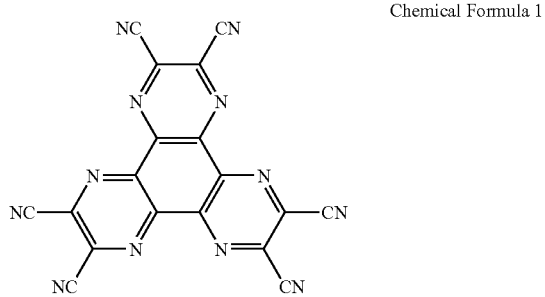

TABLE 1

| | Performance_20 $mA/cm^2$ | | | | | Life | |
|---|---|---|---|---|---|---|---|
| conditions | V | Cd/A | Lm/W | CIE_x | CIE_y | time | Δ V |
| 1. Organic layer | 5.3 | 4.8 | 3.4 | 0.149 | 0.100 | 370 hr | 2.6 V |
| 2. Buffer layer (150 Å) | 6.3 | 4.4 | 2.2 | 0.147 | 0.095 | 540 hr | 0.8 V |
| 3. Electron acceptor layer (50 Å) | 3.3 | 5.3 | 5.0 | 0.149 | 0.100 | 420 hr | 1.1 V |
| 4. Buffer layer (150 Å)/electron acceptor layer (50 Å) | 3.1 | 5.1 | 5.1 | 0.149 | 0.099 | 750 hr | 0.45 V |

As shown in table 1, if the buffer layer is 150 Å thick, and the electron acceptor layer is 50 Å thick, it can be known that not only luminance, current and color reproduction efficiency are good, and the lifetime of the device is improved, but also the device can be driven by a lowest driving voltage.

FIG. 5A illustrates a graph of a lifetime vs. a luminance of the organic luminescence display panel in accordance with a first preferred embodiment of the present invention, and FIG. 5B illustrates a graph of a lifetime vs. a delta voltage of the organic luminescence display panel in accordance with a first preferred embodiment of the present invention. Referring to FIGS. 5A, 5B and table 1, a first curve 170 denotes the case of the related art organic layer only, a second curve 172 denotes the case of the organic layer with a buffer layer having a thickness of 150 Å, a third curve 174 denotes the case of the organic layer with an electron acceptor layer having a thickness of 50 Å, and a fourth curve 176 denotes the case of the organic layer both with a buffer layer having a thickness of 150 Å and an electron acceptor layer having a thickness of 50 Å.

Referring to FIG. 5A, it can be known that the case of the organic layer both with a buffer layer having a thickness of 150 Å and an electron acceptor layer having a thickness of 50 Å has a luminance of the device not lower than the first to third curves 170, 172, and 174 even if the lifetime of the device is longer. Moreover, as shown in FIG. 5B, it can be known that the first curve 170 shows the driving voltage $\Delta V_1$ which becomes the higher as the lifetime of the device becomes the longer, and the fourth curve 176 shows the driving voltage $\Delta V_2$ which shows almost no variation even if the lifetime of the device becomes longer. Also, the first curve 170 shows the driving voltage higher than the driving voltage in the fourth curve 176. That is, since the longer the lifetime of the device, the poorer the luminance of the device, to require pulling up the driving voltage, the organic layer of the present invention shows no variation of the driving voltage even if the lifetime of the device becomes longer.

Thus, the buffer layer 222 between the first electrode 150 and the hole injection layer 218 helps interface stabilization between the first electrode 150 and the hole injection layer 218, and the electron acceptor layer 220 pulls the electrons well to make the hole transportation easy, enabling to minimize voltage pull up at the time of driving the device with a fixed current.

FIGS. 6A~6E illustrate sections of an organic luminescence display panel in accordance with a first preferred embodiment of the present invention, showing the steps of a method for fabricating the same.

Figure 6A:
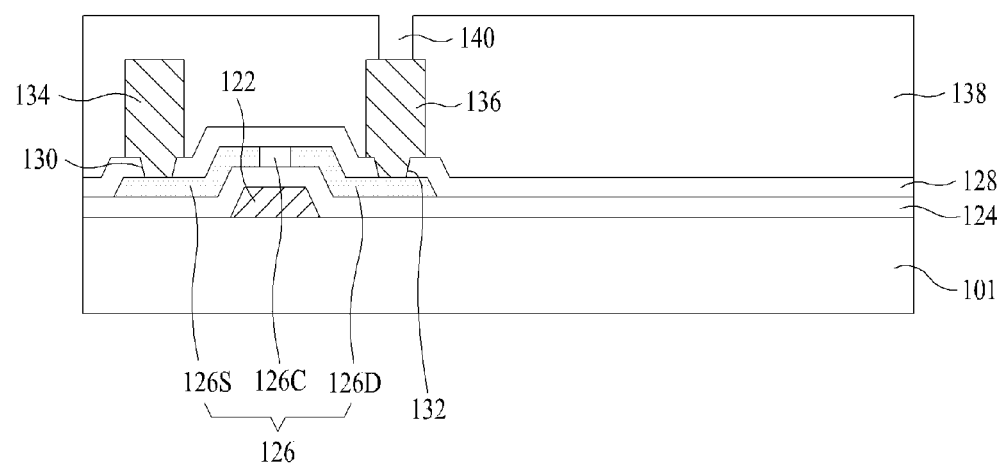
FIGS. 6A~6E illustrate sections of an organic luminescence display panel in accordance with a first preferred embodiment of the present invention, showing the steps of a method for fabricating the same.

Referring to FIG. 6A, a thin film transistor is formed on a lower substrate 101, including a semiconductor layer 126 having a gate electrode 122, a gate insulating film 124, a channel region 126C and source region 126S and drain region and 126D, an interlayer insulating film 128 having first and second contact holes 130 and 132, and a protective film 138 having source electrode 134 and drain electrode 136 and a pixel hole 140.

Figure 6B:
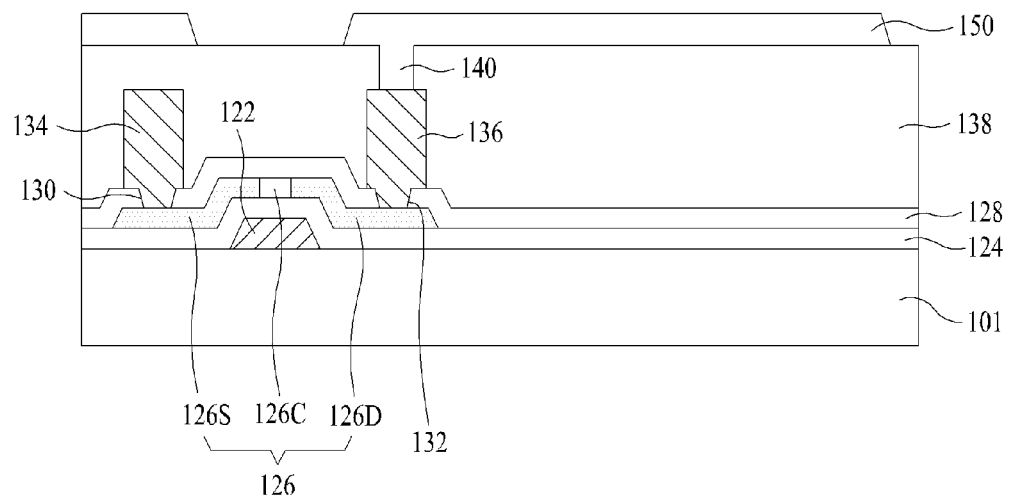

Referring to FIG. 6B, a first electrode 150 is formed, which is connected to the drain electrode 136 of the thin film transistor on the lower substrate 101.

In detail, the first electrode 150 is formed of a transparent conductive material, such as ITO (Indium Tin Oxide) and IZO (Indium Zinc Oxide) by deposition, such sputtering, on the lower substrate 101 having the thin film transistor formed thereon. The first electrode 150 is connected to the drain electrode 136 of the thin film transistor through a pixel hole 140.

Figure 6C:
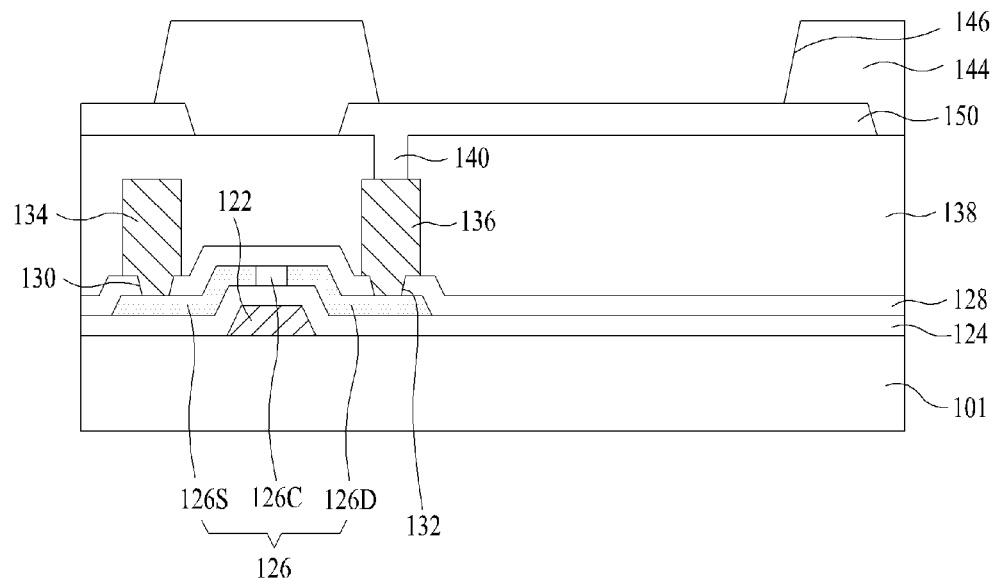

Referring to FIG. 6C, a bank insulating film 144 including an organic hole 146 is formed on the lower substrate 101 having the thin film transistor connected to the first electrode 150.

In detail, an organic insulating photoresist material is coated on an entire surface of the lower substrate 101 by a coating method, such as spin or spinless coating. The organic insulating photoresist material coated thus is subjected to photolithography and etching process with a mask, to form the bank insulating film 144 having the organic hole 146 which exposes the first electrode 150.

Figure 6D:
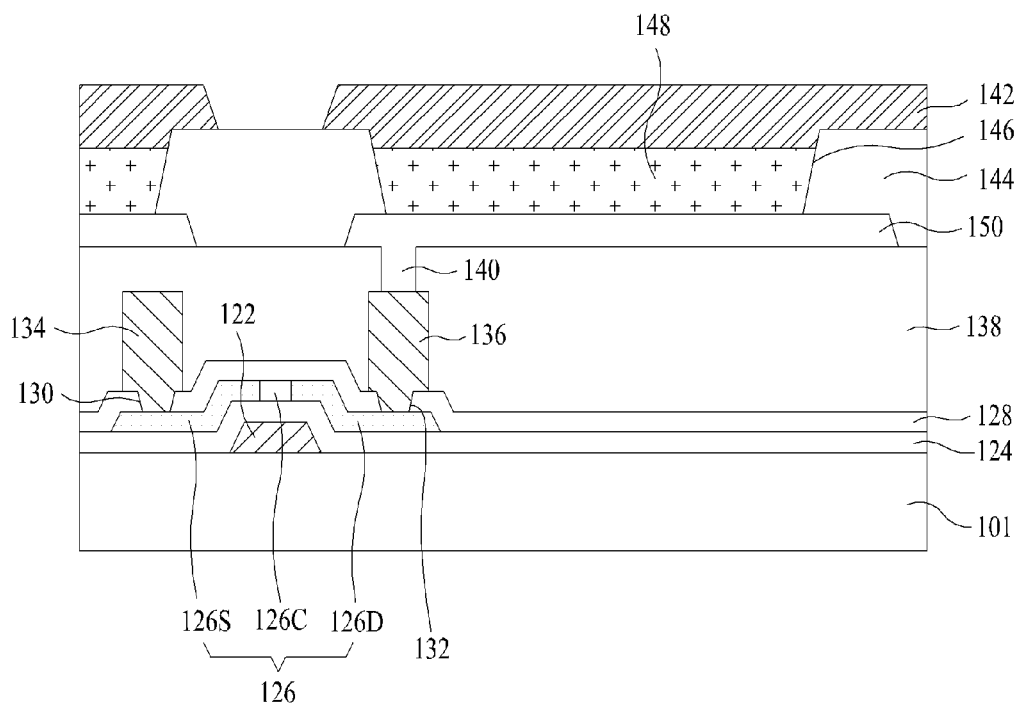

Referring to FIG. 6D, an organic layer 148 and a second electrode 142 are formed in succession on the lower substrate 101 having the bank insulating film 144 with the organic hole 146 formed thereon.

In detail, on the organic hole 146 which exposes the first electrode 150, a buffer layer 222, an electron acceptor layer 220, a hole injection layer 218, a hole transport layer 216, a light emission layer 214, an electron transport layer 212, and an electron injection layer 210 are formed in succession to form the organic layer 148. Then, a second electrode 142 is formed on the lower substrate 101 having the organic layer 148 formed thereon. The second electrode 150 is formed of a non-transparent conductive material, such as aluminum Al, on the lower substrate 101 having the organic layer 148 formed thereon. The second electrode 150 may include two or more than two layers of non-transparent conductive materials, such as magnesium Mg and aluminum Al.

Figure 7A:
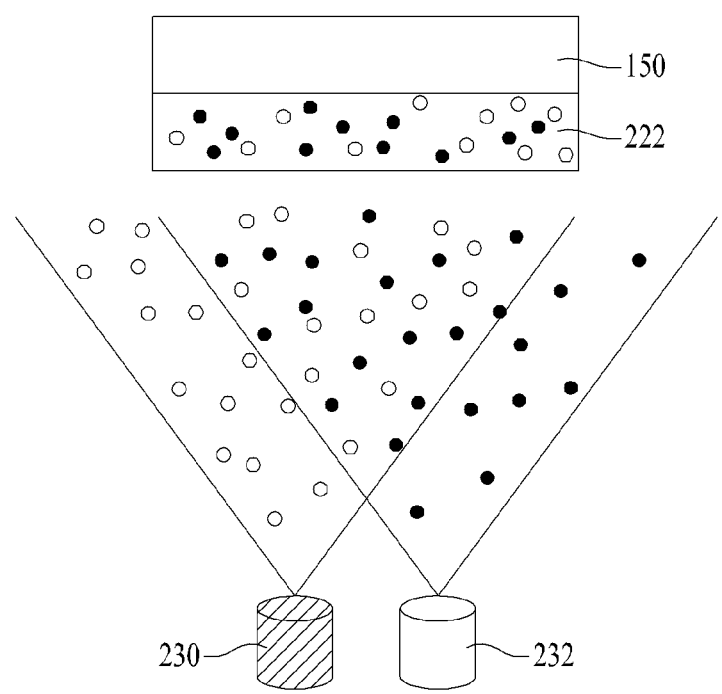
FIG. 7A illustrates the step of forming a buffer layer in the method for fabricating an organic luminescence display panel in accordance with a first preferred embodiment of the present invention.

The buffer layer is formed to a thickness of 100 Å~300 Å by co-deposition of an organic and inorganic materials 230 and 232 on the first electrode 150, preferably to a thickness of 150 Å as shown FIG. 7A. The inorganic material 230 is inorganic halide compound having fluorine such as $MgF_2$, LiF, NaF, KF, RbF, CsF, FrF, $CaF_2$, and so on. The organic material 232 is a material which permits smooth hole injection and hole transportation, such as NPB.

Figure 7B:
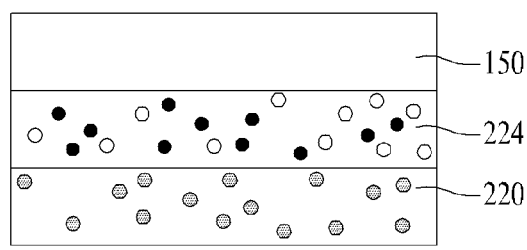
FIG. 7B illustrates the step of forming an electron accepter layer in the method for fabricating an organic luminescence display panel in accordance with a first preferred embodiment of the present invention.
Figure 7B:
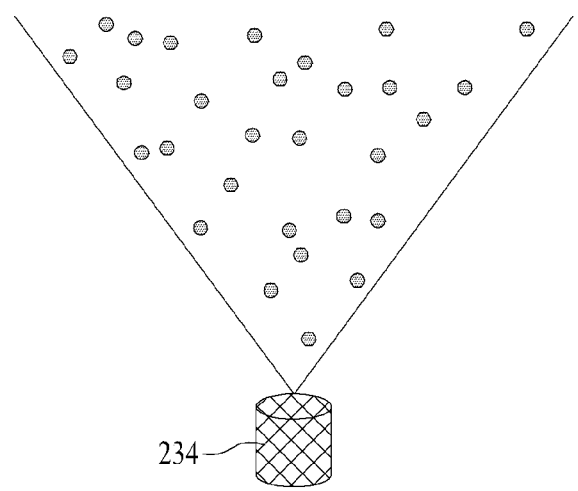

The electron acceptor layer 220 is formed of an organic material 234 having a strong electron accepting action group selected from cyanide group —CN, —NC, hydroxy group —OH, or halide group —I, Br, —F to a thickness of 10 Å~100 Å, preferably 50 Å as shown FIG. 7B.

Figure 6E:
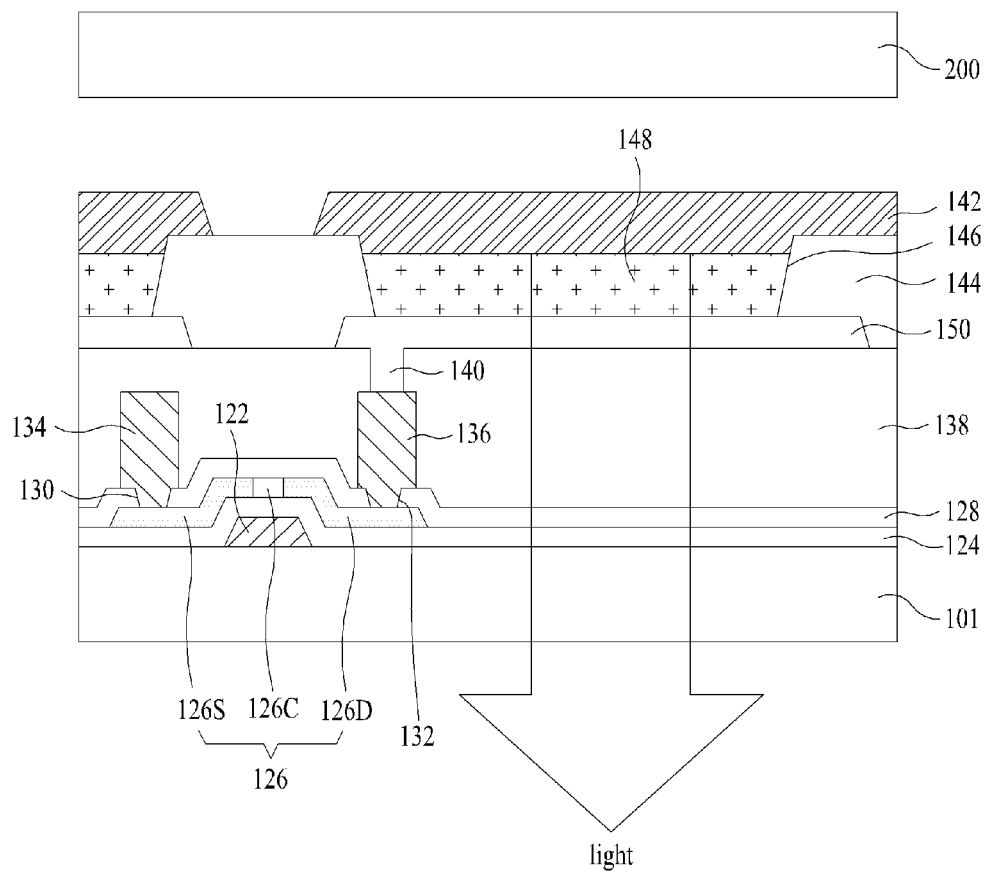

Referring to FIG. 6E, the lower substrate having the thin film transistor, the first electrode 150, the organic layer 148, the second electrode 142 formed thereon in succession and the upper substrate 200 are bonded, to form the organic luminescence display panel.

Figure 8:
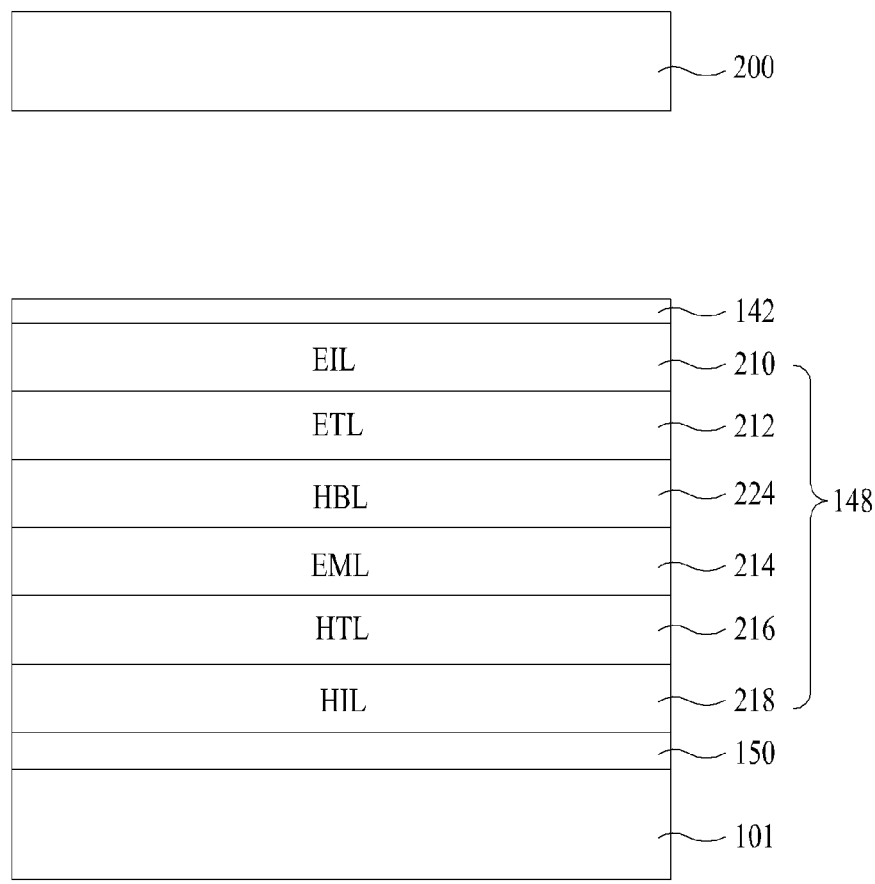
FIG. 8 illustrates a section of an organic luminescence display panel in accordance with a second preferred embodiment of the present invention, schematically.
Figure 9:
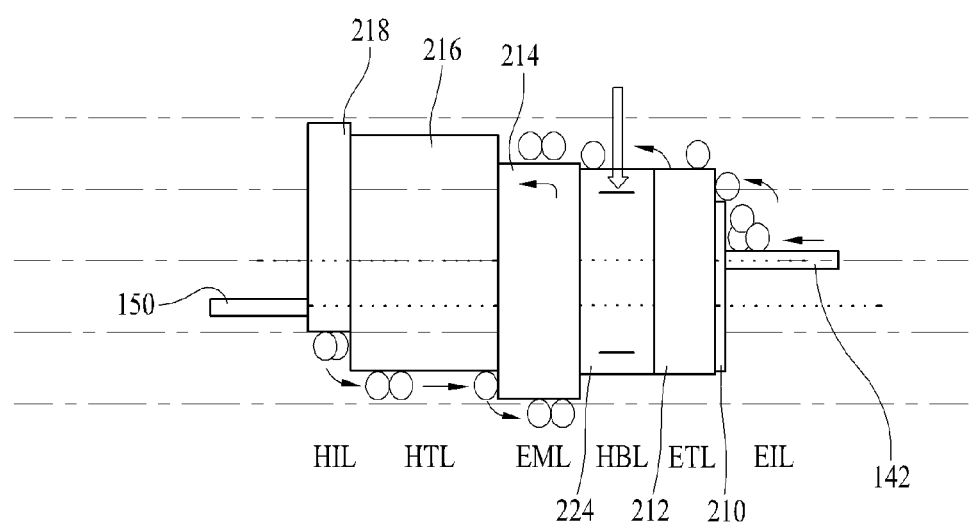
FIG. 9 illustrates an energy-band diagram of the organic layer in FIG. 8.

FIG. 8 illustrates a section of an organic luminescence display panel in accordance with a second preferred embodiment of the present invention, schematically.

Since the organic luminescence display panel in accordance with a second preferred embodiment of the present invention is identical to the organic luminescence display panel in accordance with the first preferred embodiment of the present invention except the OEL cell, only the OEL cell in accordance with the second preferred embodiment of the present invention will be described.

The OEL cell of the organic luminescence display panel in accordance with the second preferred embodiment of the present invention includes an organic layer 148 having a first electrode 150 formed on a protective film 138 covering a drive thin film transistor T2, a bank insulating film 144 with an organic hole 146 formed therein which exposes the first electrode 150, and a light emission layer formed on the first electrode 150 exposed through the organic hole 146, and a second electrode 142 formed on the organic layer 148.

The first electrode 150, an anode, is formed of a transparent conductive material, like TCO (Transparent Conductive Oxide), such as ITO (Indium Tin Oxide) and IZO (Indium Zinc Oxide).

The second electrode 142, a cathode, may be formed of two or more than two layers of non-transparent conductive materials, such as aluminum Al and the like. The two or more than two layers in the second electrode 142 may be formed of, for an example, magnesium Mg and aluminum Al.

The organic layer 148 includes a hole injection layer HIL 218, a hole transport layer HTL 216, a light emission layer EML 214, a hole block material layer HBL 224, an electron transport layer ETL 212, and an electron injection layer EIL 210 stacked on the first electrode 150 in succession. A light, emitted as an exciton which is a combination of the hole and the electron in the light emission layer 214 of the organic layer 148 returns to a bottom state, is directed toward the lower substrate 101.

The hole block material layer HBL 224 is formed of a mixture of a hole block material for trapping the holes having a high moving speed at the light emission layer 214 and an electron injection material which has an excellent electron injection property to serve to lower an electron injection energy barrier. The hole block material layer 224 is formed between the light emission layer 214 and the electron transport layer 212 to make easy the electron moving.

The hole block material is Balq (bis(2-methyl-8-quinolinolato)(p-phenylphenolato) aluminum(III)) having the following chemical formula.

Chemical formula 2

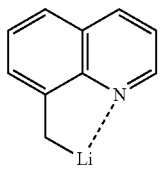

The electron injection material is Liq (Lithium quinolate) having the following chemical formula.

Chemical Formula 3

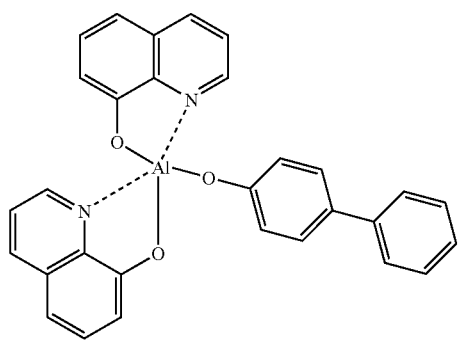

By forming the hole block material layer HBL 224 of a mixture of a hole block material and an electron injection material, the hole block material layer HBL 224 traps the holes at the light emission layer 214 at the time of fixed current driving and improves the electron injection, thereby efficiency at the time of fixed current driving is improved. The smooth hole blocking and electron injection hole made by the block material layer HBL 224 permits to improve light emission efficiency and a lifetime of the light emission layer 214.

In the meantime, the hole block material layer HBL 224 has a thickness of 10 Å~100 Å, and preferably 50 Å. The hole block material and the electron injection material are co-deposited in formation of the hole block material layer HBL 224 such that the hole block material and the electron injection material have a mixing ratio of 1:1.

Figure 10:
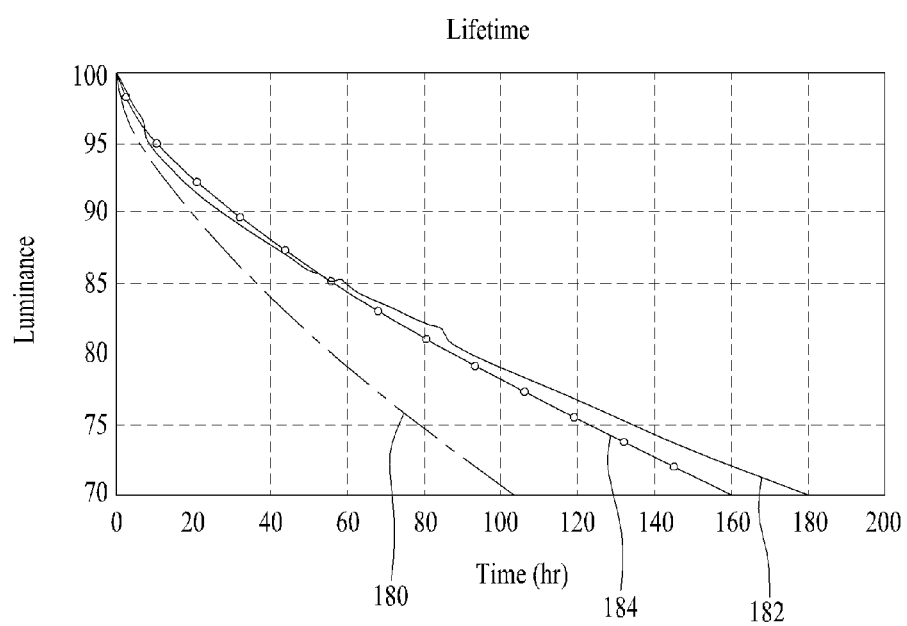
FIG. 10 illustrates a graph of a lifetime vs. a luminance of the organic luminescence display panel in accordance with a second preferred embodiment of the present invention.

Results as shown in table 2 and FIG. 10 can be obtained if the hole block material layer HBL 224 has a thickness of 50 Å.

In detail, table 2 shows test values of the organic layer in different conditions, wherein a first condition is a case of the related art organic layer only, a second condition is a case of the organic layer with the hole block material layer 224 having a thickness of 50 Å, and a third condition is a case of the organic layer with the electron block layer. In table 2, V denotes a voltage, cd/A denotes luminance, lm/W denotes a current, CIE_x and CIE_y denote color coordinates, Δ V denotes a driving voltage, and lifetime denotes a lifetime of the device. The electron injection layer 210 is formed of Liq (Lithium quinolate).

TABLE 2

| conditions | Performance_20 mA/cm² | | | | | Life time |
|---|---|---|---|---|---|---|
| | V | Cd/A | Lm/W | CIE_x | CIE_y | |
| 1. ETL (200) | 3.3 | 4.0 | 3.9 | 0.143 | 0.097 | 420 hr |
| 2. hole block material layer (50)/ ETL (150) | 3.5 | 4.9 | 4.3 | 0.142 | 0.095 | 510 hr |
| 3. hole block layer (50)/ETL (150) | 3.5 | 4.3 | 4.0 | 0.142 | 0.094 | 420 hr |

As shown in table 2, if the hole block material layer is 50 Å thick, it can be known that luminance, current and color reproduction efficiency are good, and the lifetime of the device is also improved.

FIG. 10 illustrates a graph of a lifetime vs. a luminance of the organic luminescence display panel in accordance with a second preferred embodiment of the present invention. A fifth curve 180 denotes the case of the related art organic layer only, a sixth curve 182 denotes the case of the organic layer with the hole block material layer having a thickness of 50 Å, and a seventh curve 184 denotes the case of the organic layer with the electron block layer.

Referring to FIG. 10, it can be known that the case of the organic layer with the hole block material layer having a thickness of 50 Å has a luminance of the device dropped at the least even if the lifetime of the device is longer.

Since the method for fabricating an organic luminescence display panel in accordance with a second preferred embodiment of the present invention is identical to the method for fabricating an organic luminescence display panel in accordance with the first preferred embodiment of the present invention, except the step of forming an organic layer, only the step of forming an organic layer of the second embodiment will be described.

The step of forming an organic layer of the organic luminescence display panel in accordance with the second preferred embodiment of the present invention includes the step of forming an organic layer 148 having a hole injection layer 218, a hole transport layer 216, a light emission layer 214, a hole block material layer 224, an electron transport layer 212, and an electron injection layer 210 on an organic hole 146 which exposes a first electrode 150.

Figure 11:
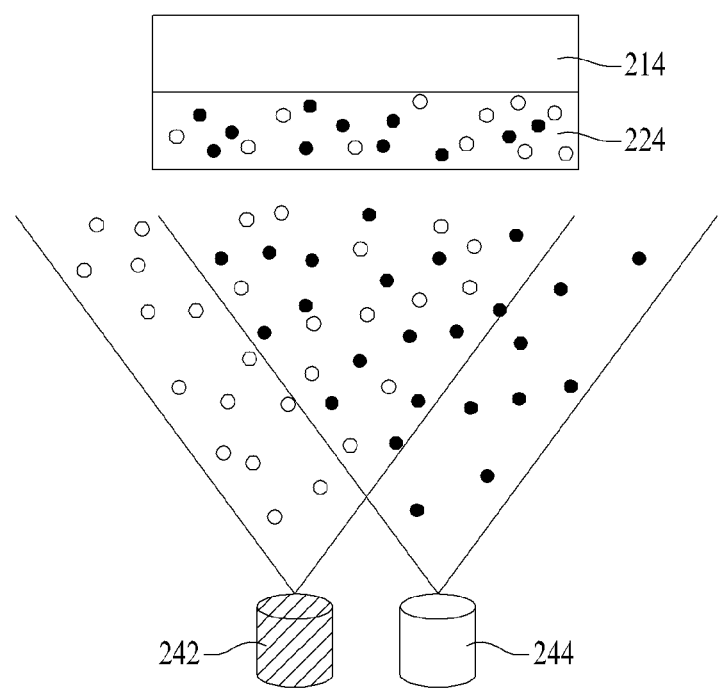
FIG. 11 illustrates the step of forming an electron/hole active layer in the method for fabricating an organic luminescence display panel in accordance with a second preferred embodiment of the present invention.

Referring to FIG. 11, the hole block material layer 224 has a thickness of 10 Å~100 Å, and is formed by co-deposition of the electron injection material 242 and the hole block material 244. The hole block material 244 is Balq (bis(2-methyl-8-quinolinolato)(p-phenylphenolato) aluminum(III)). The electron injection material 242 is formed of Liq(Lithium quinolate). The hole block material layer has a 1:1 mixing ratio of the hole block material 244 and the electron injection material 242.

Figure 12:
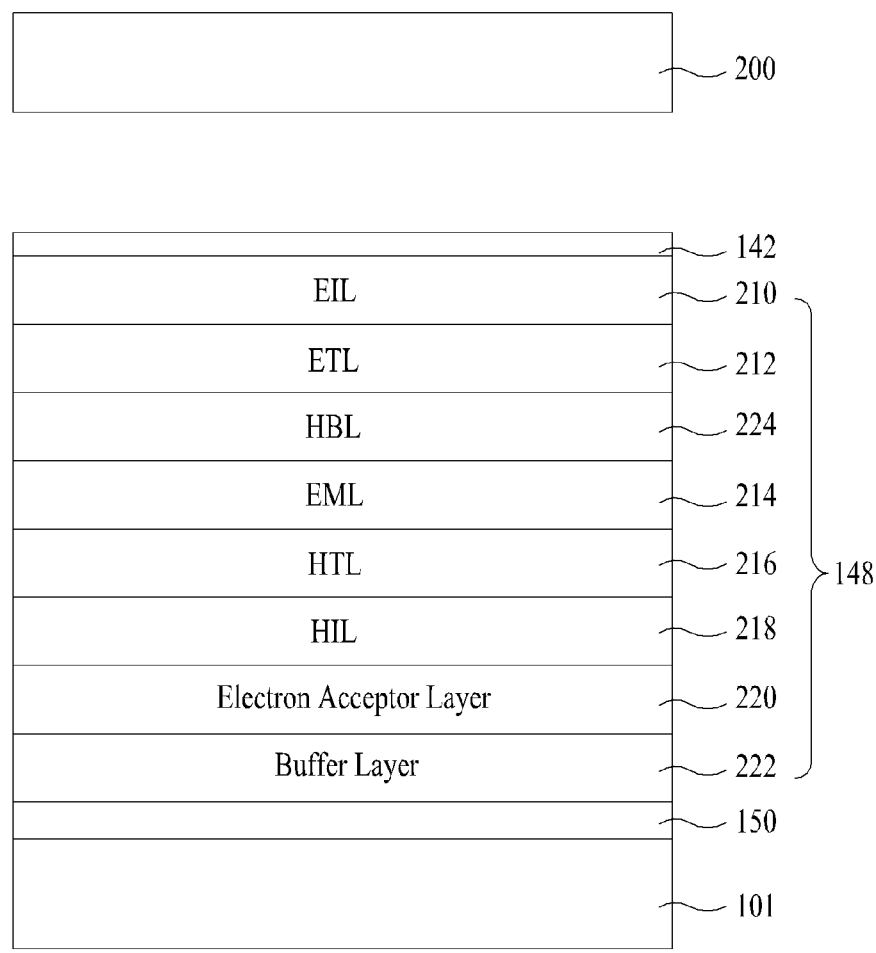
FIG. 12 illustrates a section of the organic luminescence display panel in accordance with a third preferred embodiment of the present invention, schematically.

FIG. 12 illustrates a section of the organic luminescence display panel in accordance with a third preferred embodiment of the present invention, schematically.

Since the organic luminescence display panel in accordance with a third preferred embodiment of the present invention is identical to the organic luminescence display panel in accordance with the first preferred embodiment of the present invention except the OEL cell, only the OEL cell in accordance with the second preferred embodiment of the present invention will be described.

The OEL cell of the organic luminescence display panel in accordance with the third preferred embodiment of the present invention includes an organic layer 148 having a first electrode 150 formed on a protective film 138 covering a drive thin film transistor T2, a bank insulating film 144 with an organic hole 146 formed therein which exposes the first electrode 150, and a light emission layer formed on the first electrode 150 exposed through the organic hole 146, and a second electrode 142 formed on the organic layer 148.

The first electrode 150, an anode, is formed of a transparent conductive material, like TCO (Transparent Conductive Oxide), such as ITO (Indium Tin Oxide) and IZO (Indium Zinc Oxide).

The second electrode 142, a cathode, may be formed of two or more than two layers of non-transparent conductive materials, such as aluminum Al and the like. The two or more than two layers in the second electrode 142 may be formed of, for an example, magnesium Mg and aluminum Al.

The organic layer 148 includes a buffer layer 222, an electron acceptor layer 220, a hole injection layer HIL 218, a hole transport layer HTL 216, a light emission layer EML 214, a hole block material layer 224, an electron transport layer ETL 212, and an electron injection layer EIL 210 stacked on the first electrode 150 in succession. A light, emitted as an exciton which is a combination of the hole and the electron in the light emission layer 214 of the organic layer 148 returns to a bottom state, is directed toward the lower substrate. Since the buffer layer 222 and the electron acceptor layer 220 are identical to ones in the first embodiment, and the hole block material layer 224 is identical to one in the second embodiment, description of these will be omitted.

In the meantime, though the organic luminescence display panel in accordance with the first to third embodiment of the present invention are described taking an organic luminescence display panel which emits the light to backward as an example, the organic luminescence display panel of the present invention is also applicable to an organic luminescence display panel which emits the light to forward.

Moreover, though the organic luminescence display panel of the present invention has a cell driver and an organic luminescence cell connected to the cell driver formed on a substrate, the present invention is also applicable to a dual plate type organic luminescence display panel which has the cell driver and the organic luminescence cell formed on different substrates and bonded together.

As has been described, the organic luminescence display panel and the method for fabricating the same of the present invention have the following advantages.

In the organic luminescence display panel and the method for fabricating the same of the present invention, a buffer layer is formed between one of two electrodes of an OEL cell and a hole injection layer of an inorganic material of inorganic halide compound having fluorine and an organic material, an electron acceptor layer is formed between the buffer layer and the hole injection layer of an organic material having an electron acceptor group, and a hole block material layer is formed between a light emission layer and an electron transport layer of a mixture of an electron injection material of Liq and a hole blocking material of Balq.

According to this, the buffer layer stabilizes an interface between the electrode and the hole injection layer, preventing thermal degradation and stress of the device at the time of fixed current driving to improve a lifetime of the device. The smooth hole transportation and injection owing to the electron acceptor layer permits to minimize voltage pull up at the time of application of a fixed current.

The hole block material layer traps the holes having a fast moving speed at the light emission layer, and lowers an electron injection energy barrier, making smooth hole blocking and electron injection, to improve light emission efficiency and a lifetime of the light emission layer.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic luminescence display panel comprising:
a first electrode connected to a thin film transistor formed on a substrate;
an organic layer having a light emission layer formed on the first electrode;
a second electrode formed opposite to the first electrode with the organic layer disposed therebetween;
a buffer layer formed between the first electrode and the light emission layer of a mixture of an inorganic material of an inorganic halide compound having fluorine and an organic material for interface stabilization between the first electrode and the organic layer; and
an electron acceptor layer of an organic material comprising a material having Chemical Formula 1:

[Chemical Formula 1]

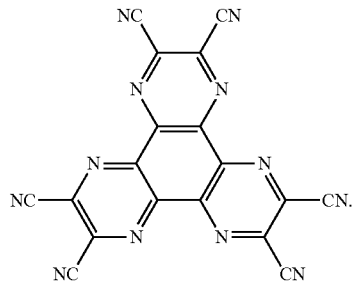

2. The organic luminescence display panel as claimed in claim 1, wherein the inorganic material is an inorganic halide compound having fluorine selected from $MgF_2$, LiF, NaF, KF, RbF, CsF, FrF, or $CaF_2$, and the organic material for interface stabilization between the first electrode and the organic layer is NPB (N, N-di(naphthalene-1-yl)-N,N-diphenyl-benzidene), wherein the buffer layer is formed by co-deposition of the inorganic and organic materials.

3. The organic luminescence display panel as claimed in claim 1, wherein the buffer layer has a thickness of 100 Å~300 Å, and the electron acceptor layer has a thickness of 50 Å~100 Å.

4. The organic luminescence display panel as claimed in claim 1, wherein the buffer layer is formed of a mixture of the inorganic material and the organic material mixed in a ratio of 1:3.

5. An organic luminescence display panel comprising:
a first electrode connected to a thin film transistor formed on a substrate;
an organic layer having a light emission layer formed on the first electrode;

a second electrode formed opposite to the first electrode with the organic layer disposed therebetween;

a hole block material layer formed between a light emission layer and the second electrode of a mixture of a hole blocking material of Balq (bis(2-methyl-8-quinolinolato)(p-phenylphenolato) aluminum(III)) and an electron injection material of Liq (Lithium quinolate), for trapping holes at the light emission layer;

a buffer layer formed between the first electrode and the light emission layer of a mixture of an inorganic material of an inorganic halide compound having fluorine and an organic material for interface stabilization between the first electrode and the organic layer; and an electron acceptor layer of an organic material comprising a material having Chemical Formula 1:

[Chemical Formula 1]

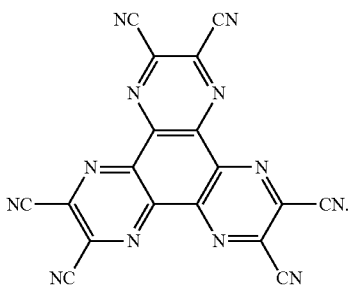

6. The organic luminescence display panel as claimed in claim 5, wherein the inorganic material is an inorganic halide compound having fluorine selected from MgF2, LiF, NaF, KF, RbF, CsF, FrF, or CaF2, and the organic material for interface stabilization between the first electrode and the organic layer is NPB (N,N-di(naphthalene-1-yl)-N,N-diphenyl-benzidene), wherein the buffer layer is formed by co-deposition of the inorganic and organic materials in a mixing ratio of 1:3.

7. The organic luminescence display panel as claimed in claim 5, wherein the buffer layer has a thickness of 100 Å~300 Å, and the electron acceptor layer has a thickness of 50 Å~100 Å.

8. The organic luminescence display panel as claimed in claim 5, wherein the hole block material layer is formed to have a thickness of 10 Å~100 Å by co-deposition such that the hole block material layer has a mixing ratio of the electron injection material and then hole blocking material of 1:1.

9. The organic luminescence display panel as claimed in claim 1, wherein the inorganic material is an inorganic halide compound having $MgF_2$ or $CaF_2$.

10. The organic luminescence display panel as claimed in claim 5, wherein the inorganic material is an inorganic halide compound having $MgF_2$ or $CaF_2$.

* * * * *